United States Patent
Zhang

(10) Patent No.: US 11,869,625 B2
(45) Date of Patent: Jan. 9, 2024

(54) DATA TRANSMISSION CIRCUIT AND METHOD, AND STORAGE DEVICE

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/580,757

(22) Filed: Jan. 21, 2022

(65) Prior Publication Data

US 2022/0310136 A1    Sep. 29, 2022

Related U.S. Application Data

(63) Continuation of application No. PCT/CN2021/109118, filed on Jul. 29, 2021.

(30) Foreign Application Priority Data

Mar. 29, 2021 (CN) .......................... 202110336696.5

(51) Int. Cl.
| | | |
|---|---|---|
| *G11C 7/10* | (2006.01) | |
| *G06F 13/42* | (2006.01) | |
| *G06F 13/40* | (2006.01) | |

(52) U.S. Cl.
CPC ........ *G11C 7/1039* (2013.01); *G06F 13/4068* (2013.01); *G06F 13/4221* (2013.01); *G06F 13/4282* (2013.01); *G11C 7/1069* (2013.01); *G11C 7/1096* (2013.01)

(58) Field of Classification Search
CPC ............... G11C 7/1039; G01F 13/4068; G01F 13/4221; G01F 13/4282

USPC ..................................................... 365/189.05
See application file for complete search history.

(56) References Cited

U.S. PATENT DOCUMENTS

| 8,112,680 B2 | 2/2012 | Chung | |
|---|---|---|---|
| 2008/0256414 A1 | 10/2008 | Chung | |
| 2010/0058104 A1* | 3/2010 | Ishikawa | H04L 7/02 |
| | | | 713/600 |

FOREIGN PATENT DOCUMENTS

| CN | 105208467 A | 12/2015 |
|---|---|---|
| CN | 105826274 A | 8/2016 |
| CN | 107454385 A | 12/2017 |

* cited by examiner

*Primary Examiner* — Vu A Le
(74) *Attorney, Agent, or Firm* — Cooper Legal Group, LLC

(57) ABSTRACT

A data transmission circuit and method, and a storage device are provided. The data transmission circuit includes a serial-parallel conversion module, a comparison module, a data conversion module and a write circuit module. The serial-parallel conversion module receives a plurality of pieces of external data in batches and outputs initial parallel data according to the external data. The comparison module compares the received initial parallel data with global data to output a comparison result. The data conversion module, responsive to that the comparison result indicates that the preset threshold is exceeded, inverts the initial parallel data and transmits the inverted data to a data bus, and responsive to that the comparison result indicates that the preset threshold is not exceeded, transmits the initial parallel data to the data bus. The write circuit module transmits data on the data bus to a global data bus.

20 Claims, 15 Drawing Sheets

DATA TRANSMISSION CIRCUIT AND METHOD, AND STORAGE DEVICE

CROSS-REFERENCE TO RELATED APPLICATIONS

This is a continuation of International Patent Application No. PCT/CN2021/109118, filed on Jul. 29, 2021, which claims priority to Chinese Patent Application No. 202110336696.5, filed on Mar. 29, 2021. The disclosures of International Patent Application No. PCT/CN2021/109118 and Chinese Patent Application No. 202110336696.5 are hereby incorporated by reference in their entireties.

BACKGROUND

With rapid developments of semiconductor technologies, the density and the number of storage units in a storage unit array of a semiconductor storage device are continuously increased to meet the requirements for storage capability of the semiconductor storage device by the market. To improve the speed and efficiency for data writing or data reading of the semiconductor storage device, data is generally written into or read from the semiconductor storage device in batches.

On one hand, the increase of the density and the number of the storage units in the storage unit array results in an increase of the length of a data transmission path between a data pad and a storage array region. On the other hand, data writing or data reading in batches requires an increase of a data transmission bandwidth of a data transmission channel between the data pad and the storage array region. Hence, the power consumption of the data transmission path between the data pad and the storage array region is significantly increased.

If the power consumption of the data transmission path between the data pad and the storage array region is reduced while ensuring that the density and the number of the storage units in the storage unit array do not reduce and the efficiency for reading data or writing data in batches is not lowered, the power saving performance of the semiconductor storage device is effectively improved.

SUMMARY

This application relates to the technical field of semiconductor storage, and in particular to a data transmission circuit and method, and a storage device.

A first aspect of this disclosure provides a data transmission circuit. The data transmission circuit includes a serial-parallel conversion module, a comparison module, a data conversion module and a write circuit module. The serial-parallel conversion module is configured to receive a plurality of pieces of external data in batches and output initial parallel data according to the external data. A preset bit width of the initial parallel data is a sum of bit widths of the plurality of pieces of external data. The comparison module is configured to receive global data on a global data line and the initial parallel data, and compare the initial parallel data with the global data to output a comparison result of whether the number of bits of the initial parallel data which are different from the global data exceeds a preset threshold. The initial parallel data and the global data have identical preset bit widths. The data conversion module is electrically connected to the serial-parallel conversion module, the comparison module and a data bus, and is configured to, responsive to that the comparison result indicates that preset threshold is exceeded, invert the initial parallel data and then transmit the inverted data to the data bus, and responsive to that the comparison result indicates that the preset threshold is not exceeded, transmit the initial parallel data to the data bus. The write circuit module is configured to transmit data of the data bus to a global data bus. A length of a data transmission path between the serial-parallel conversion module and the data conversion module is less than a length of a data transmission path between the data conversion module and the write circuit module.

A second aspect of this disclosure provides a storage device, including the data transmission circuit described above, and configured to store and transmit data of a read operation or a write operation.

A third aspect of this disclosure provides a data transmission method. The data transmission method includes operations as follows. A serial-parallel conversion module is controlled to receive a plurality of pieces of external data in batches and output initial parallel data according to the external data. A preset bit width of the initial parallel data is equal to a sum of bit widths of the plurality of pieces of external data, A comparison module is controlled to receive global data on a global data line and the initial parallel data, and compare the initial parallel data with the global data to output a comparison result of whether the number of bits of the initial parallel data which are different from the global data exceeds a preset threshold. The initial parallel data and the global data have identical preset bit widths. A data conversion module is controlled to, responsive to that the comparison result indicates that preset threshold is not exceeded, invert the initial parallel data and then transmit the inverted data to the data bus, and responsive to that the comparison result indicates that the preset threshold is not exceeded, transmit the initial parallel data to the data bus. A write circuit module is controlled to transmit data of the data bus to a global data bus. A length of a data transmission path between the serial-parallel conversion module and the data conversion module is less than a length of a data transmission path between the data conversion module and the write circuit module.

Details of the embodiments of the disclosure are provided in the accompanying drawings and descriptions below. According to the description of the description, accompanying drawings and claims, a person skilled in the art would understand other technical features, a solved problem, and a technical effect of the disclosure.

BRIEF DESCRIPTION OF THE DRAWINGS

To explain the technical solutions in the embodiments of this disclosure more clearly, the accompanying drawings required to be used in the descriptions of the embodiments are simply introduced below. Apparently, the accompanying drawings in the descriptions below are merely some embodiments of this disclosure. Additional details or examples for describing the accompanying drawings should not be considered as the limitation to the scope of any one of the invention creation of this disclosure, currently described embodiments or preferable implements.

DETAILED DESCRIPTION

To facilitate understanding of this disclosure, this disclosure would be described more comprehensively with reference to the related accompanying drawings. A preferred embodiment of this disclosure is given in the accompanying drawings. However, this disclosure can be implemented in many different forms, and is not limited to the embodiments described herein. On the contrary, the purpose for providing the embodiments is to enable the contents of this disclosure to be more thorough and comprehensive.

Unless otherwise defined, all techniques and scientific terms used herein have the same meanings as those generally understood by a person skilled in the technical field of this disclosure. The terms used in the description of this disclosure herein are only used for the purpose of describing a specific embodiment, rather than the purpose of limiting this disclosure. In addition, some terms used through the description and the accompanying claims refer to specific components. A person skilled in the art would understand that a manufacturer may use different names for referring to a component. This document would not desire to distinguish components with different names but a same function. In the following descriptions and embodiments, terms "comprising" and "including" are both used in an open type, and therefore, should be interpreted as "comprising, but not limited to . . . ". Similarly, the term "connecting" desires to express an indirect or direct electric connection. Accordingly, if a device is connected to another device, connection may be completed through the direction electric connection, or may be completed through the indirection electric connection between other devices and a connection member.

It should be understood that the terms "first", "second" and the like may be used for describing various components herein. However, the components should not be limited by these terms. These terms are merely used for distinguishing one component from another component. For example, without departing from the scope of this disclosure, a first component may be referred to as a second component, and similarly, the second component may be referred to as the first component.

Figure 1:
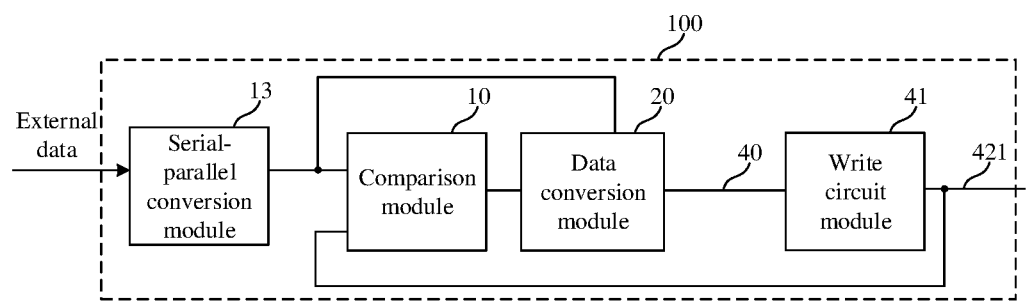
FIG. 1 is a schematic diagram of a circuitry principle of a data transmission circuit provided by a first embodiment of this disclosure.

With reference to FIG. 1, an embodiment of this disclosure provides a data transmission circuit 100, which includes a serial-parallel conversion module 13, a comparison module 10, a data conversion module 20, and a write circuit module 41. The serial-parallel conversion module 13 is configured to receive a plurality of pieces of external data in batches and output initial parallel data according to the external data. A preset bit width of the initial parallel data is a sum of bit widths of the plurality of pieces of external data. The comparison module 10 is configured to receive global data on a global data line 421 and the initial parallel data, and compare the initial parallel data with the global data to output a comparison result of whether the number of bits of the initial parallel data which are different from the global data exceeds a preset threshold. The initial parallel data and the global data have identical preset bit widths. The data conversion module 20 is electrically connected to the serial-parallel conversion module 13, the comparison module 10 and a data bus, and is configured to, responsive to that the comparison result indicates that the preset threshold is exceeded, invert the initial parallel data and then transmit the inverted data to the data bus, and responsive to that the comparison result indicates that the preset threshold is not exceeded, transmit the initial parallel data to the data bus. The write circuit module 41 is configured to transmit data of the data bus to a global data bus. A length of a data transmission path between the serial-parallel conversion module 13 and the data conversion module 20 is less than a length of a data transmission path between the data conversion module 20 and the write circuit module 41.

As an example, continuously referring to FIG. 1, the serial-parallel conversion module 13 is configured to receive a plurality of pieces of external data in batches and output initial parallel data according to the external data. A preset bit width of the initial parallel data is a sum of bit widths of the plurality of pieces of external data, so as to implement data input in batches. The comparison module 10 is configured to compare the received initial parallel data with the global data to output a comparison result of whether the number of bits of the initial parallel data which are different from the global data exceeds a preset threshold. The initial parallel data and the global data have identical preset bit widths. The data conversion module 20 is configured to, responsive to that the comparison result indicates that preset threshold is not exceeded, invert the initial parallel data and then transmit the inverted data to the data bus, and responsive to that the comparison result indicates that the preset threshold is not exceeded, transmit the initial parallel data to the data bus, so that the write circuit module 41 transmits data of the data bus to the global data bus. The number of inverting the write data during the transmission between the data pad and the storage array region are reduced under the premise of ensuring the transmission accuracy of the write data in batch, so as to effectively reduce the power consumption of the data in the transmission path. A length of a data transmission path between the serial-parallel conversion module 13 and the data conversion module 20 is less than a length of a data transmission path between the data conversion module 20 and the write circuit module 41, so as to avoid an abnormality from occurring in the write data during the transmission in the data bus, and effectively improve the accuracy of the write data during the transmission in the data bus having a long transmission path. The power consumption of the data transmission path between the data pad and the storage array region is reduced while ensuring that the density and the number of the storage units in the storage unit array do not reduce and the efficiency for reading data or writing data in batches is not lowered, thereby effectively improving the power saving performance of the semiconductor storage device.

Figure 2:
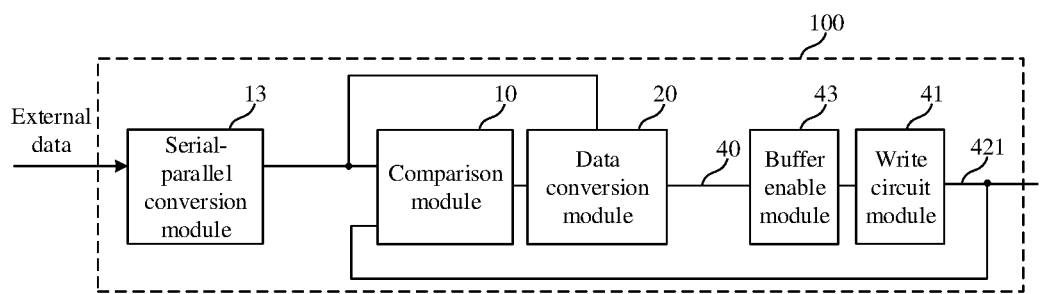
FIG. 2 is a schematic diagram of a circuitry principle of a data transmission circuit provided by a second embodiment of this disclosure.

Furthermore, with reference to FIG. 2, in an embodiment of this disclosure, the data transmission circuit 100 further includes a buffer enable module 43. The data conversion module 20 is connected to the write circuit module 41 through at least one buffer enable module 43 in sequence and is configured to buffer data transmitted by the data bus, thereby reducing an input current of the data bus while ensuring the accuracy of the write data during the transmission of the data bus having a long transmission path, so and further reducing the power consumption of the data transmission path between the data pad and the storage array region.

Figure 3:
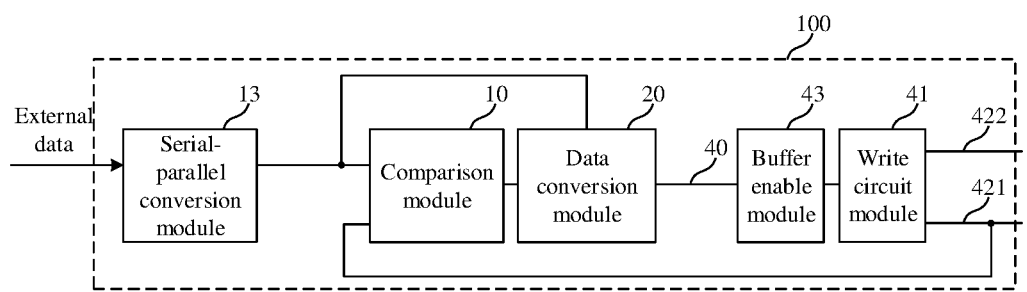
FIG. 3 is a schematic diagram of a circuitry principle of a data transmission circuit provided by a third embodiment of this disclosure.

Furthermore, with reference to FIG. 3, in an embodiment of this disclosure, the global data bus includes a global data line 421 and a complementary global data line 422, The global data line 421 and the complementary global data line 422 transmit signals which are inverted each other. The transmitting data of the data bus to the global data bus includes: transmitting the data of the data bus to the global data line 421; and inverting the data of the data bus and then transmitting the inverted to the complementary global data line 422. In this embodiment, the data transmitted by the complementary global data line 422 and the data transmitted by the global data line 421 can be referred for each other, and can further improve the accuracy of the write data transmitted to a rear-stage data line through the write circuit module 41.

Figure 4:
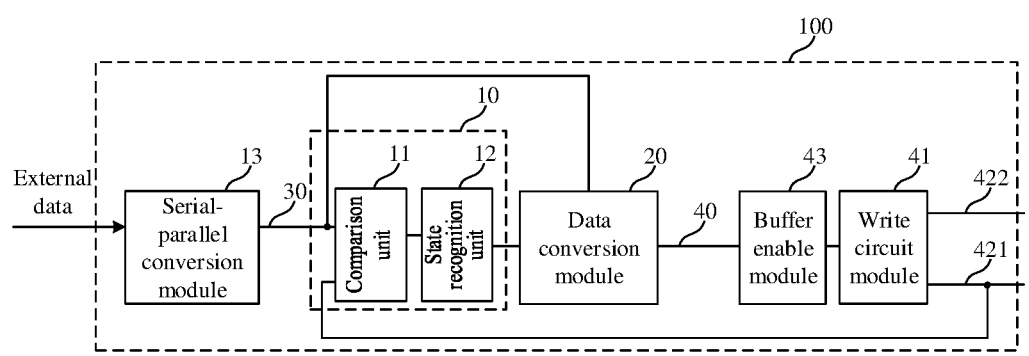
FIG. 4 is a schematic diagram of a circuitry principle of a data transmission circuit provided by a fourth embodiment of this disclosure.

Furthermore, with reference to FIG. 4, in an embodiment of this disclosure, the comparison module 10 includes a comparison unit 11 and a state recognition unit 12. The comparison unit 11 is connected to the serial-parallel conversion module 13 through a first data line 30, and is configured to compare the initial parallel data with the global data bit by bit and output comparison state data of each bit. The state recognition unit 12 is electrically connected to the comparison unit 11, and is configured to perform statistics on the comparison state data of all of the bits and output a comparison result according to a statistic result, so that the data conversion module 20 inverts the initial parallel data provided by the serial-parallel conversion module 13 and then transmits the inverted data to the data bus 40 responsive to that the comparison result indicates that the preset threshold is exceeded, for example, the threshold is a half of the preset bit width, and the data conversion module 20 transmits the initial parallel data provided by the serial-parallel conversion module 13 to the data bus 40 responsive to that the comparison result indicates that the preset threshold is not exceeded. The number of inverting data on the data bus is reduced while ensuring the accuracy of the data transmission. Therefore, the number of inverting the write data during the transmission between the data pad and the storage array region is decreased while ensuring the transmission accuracy of the write data in batches, so as to effectively reduce the power consumption of the data in the transmission path.

Figure 5A:
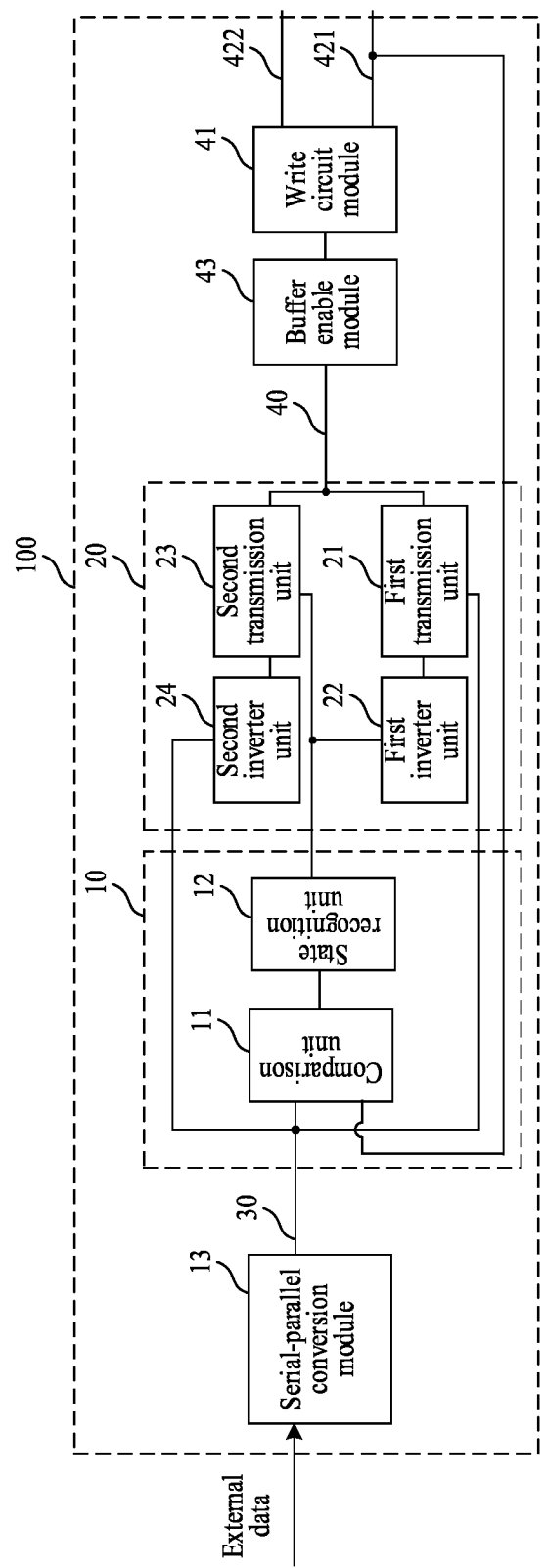
FIG. 5A is a schematic diagram of a circuitry principle of a data transmission circuit provided by a fifth embodiment of this disclosure.
Figure 5B:
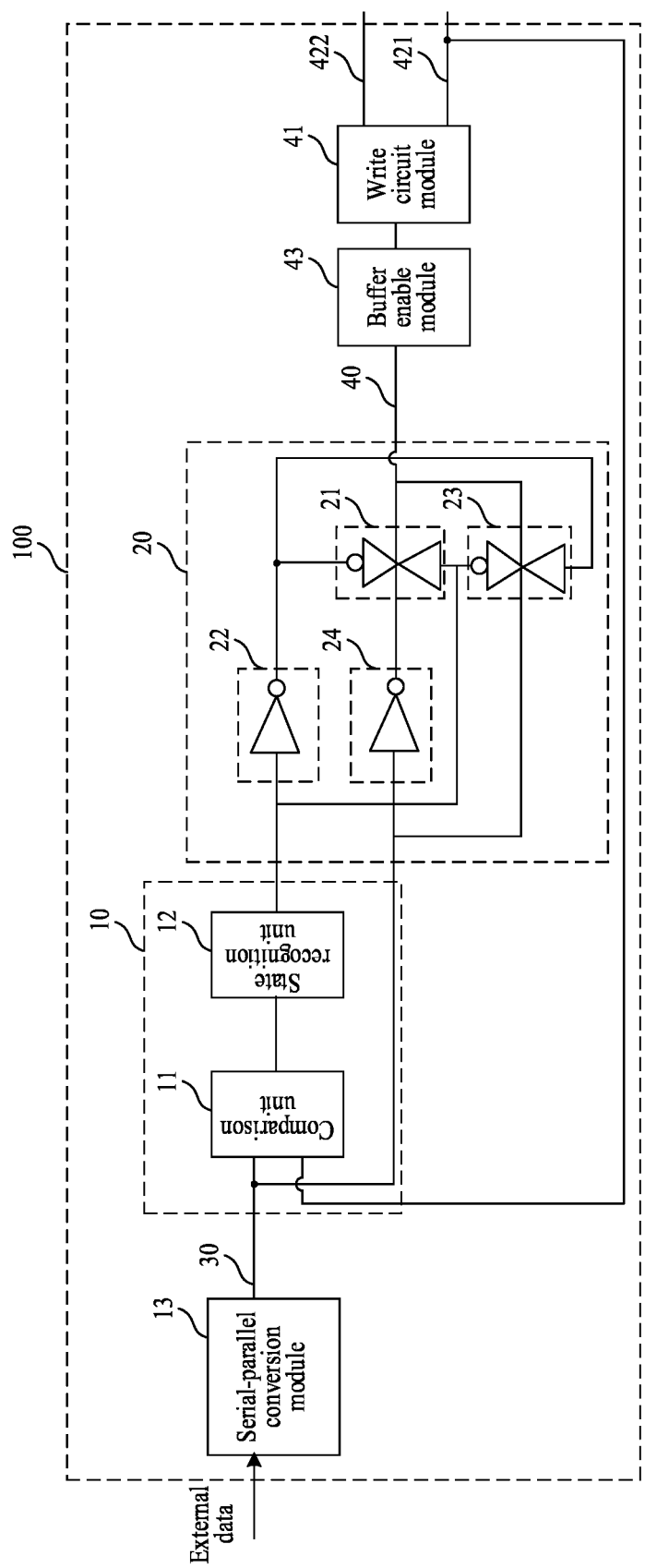
FIG. 5B is a schematic diagram of an implementation of FIG. 5A.

Furthermore, with reference to FIG. 5A and FIG. 5B, in an embodiment of this disclosure, the data conversion module 20 includes a first transmission unit 21, a first inverter unit 22, a second transmission unit 23, and a second inverter unit 24. The first transmission unit 21 is electrically connected to the serial-parallel conversion module 13 and the data bus 40, is electrically connected to an output end of the state recognition unit 12 through the first inverter unit 22, and is configured to, responsive to that the comparison result indicates that the preset threshold is not exceeded, transmit the initial parallel data to the data bus 40. The preset threshold is a half of the preset bit width. The second transmission unit 23 is electrically connected to the data bus and the output end of the state recognition unit 12, is electrically connected to the serial-parallel conversion module 13 through the second inverter unit 24, and is configured to, responsive to that the comparison result indicates that the preset threshold is exceeded, invert the initial parallel data and then transmit the inverted data to the data bus 40. The number of reverting the data on the data bus 40 are reduced while ensuring the transmission accuracy of data on the data bus 40 is ensured in this embodiment, so as to effectively reduce the power consumption during the data transmission on the data bus 40.

Figure 6:
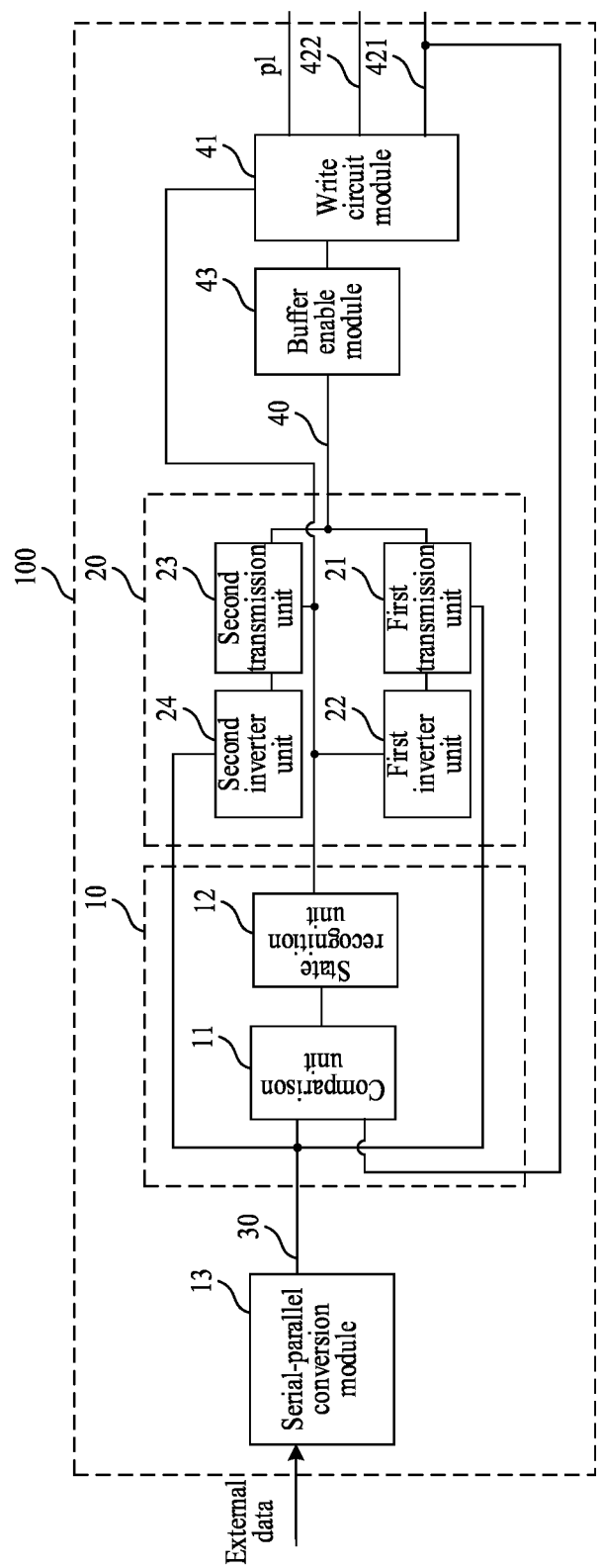
FIG. 6 is a schematic diagram of a circuitry principle of a data transmission circuit provided by a sixth embodiment of this disclosure.

Furthermore, with reference to FIG. 6, in an embodiment of this disclosure, the write circuit module 41 is configured to receive a comparison result output by the state recognition unit 12 and generate a data polarity identification signal p1 according to the comparison result, so as to facilitate subsequent recovery of the inverted data according to the data polarity identification signal p1, to ensure the accuracy of data transmission.

Figure 7:
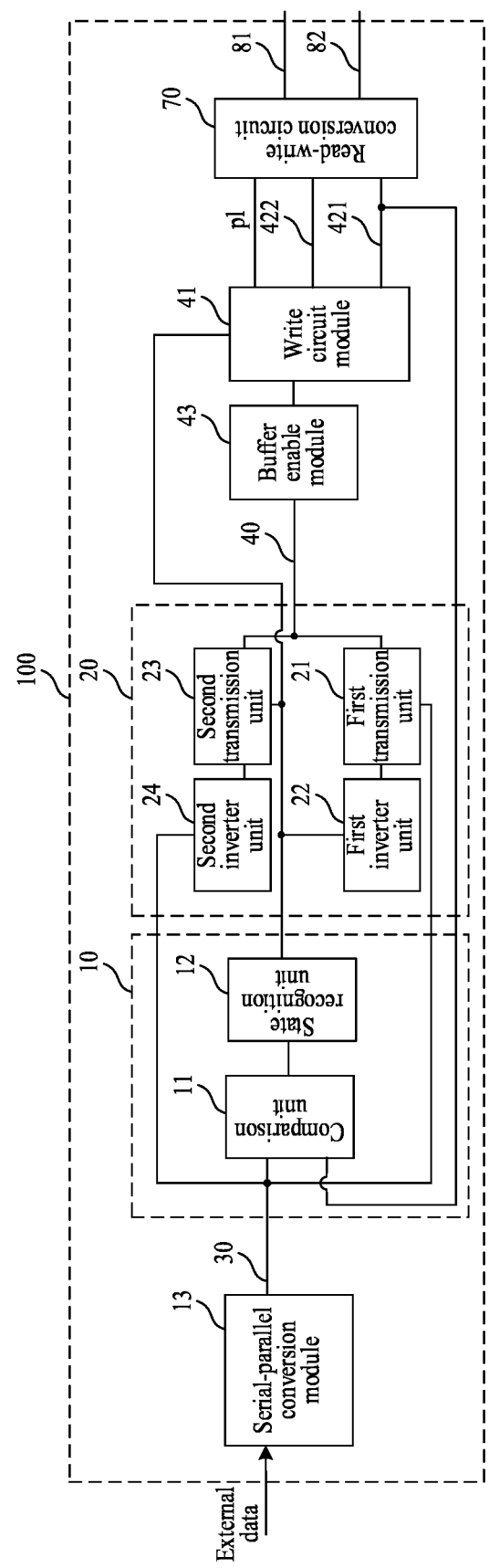
FIG. 7 is a schematic diagram of a circuitry principle of a data transmission circuit provided by a seventh embodiment of this disclosure.

Furthermore, with reference to FIG. 7, in an embodiment of this disclosure, the data transmission circuit 100 further includes a read-write conversion circuit 70. The read-write conversion circuit 70 generates first data according to the data polarity identification signal and data on the global data bus. The first data may include the data on the global data line 421 and the data obtained after inverting the data on the global data line 421. The read-write conversion circuit 70 transmits the first data to a local data line 81 or a complementary local data line 82. The local data line 81 and the complementary local data line 82 transmit signals inverted to each other, so as to accurately transmit a plurality of pieces of external data inputted by the serial-parallel conversion module 13 in batches to the local data line 81. Since the data transmitted by the complementary local data line 82 and the data transmitted by the local data line 81 can be referred for each other, the accuracy degree of the data transmitted to the local data line 81 through the global data line 421 can be improved.

Figure 8:
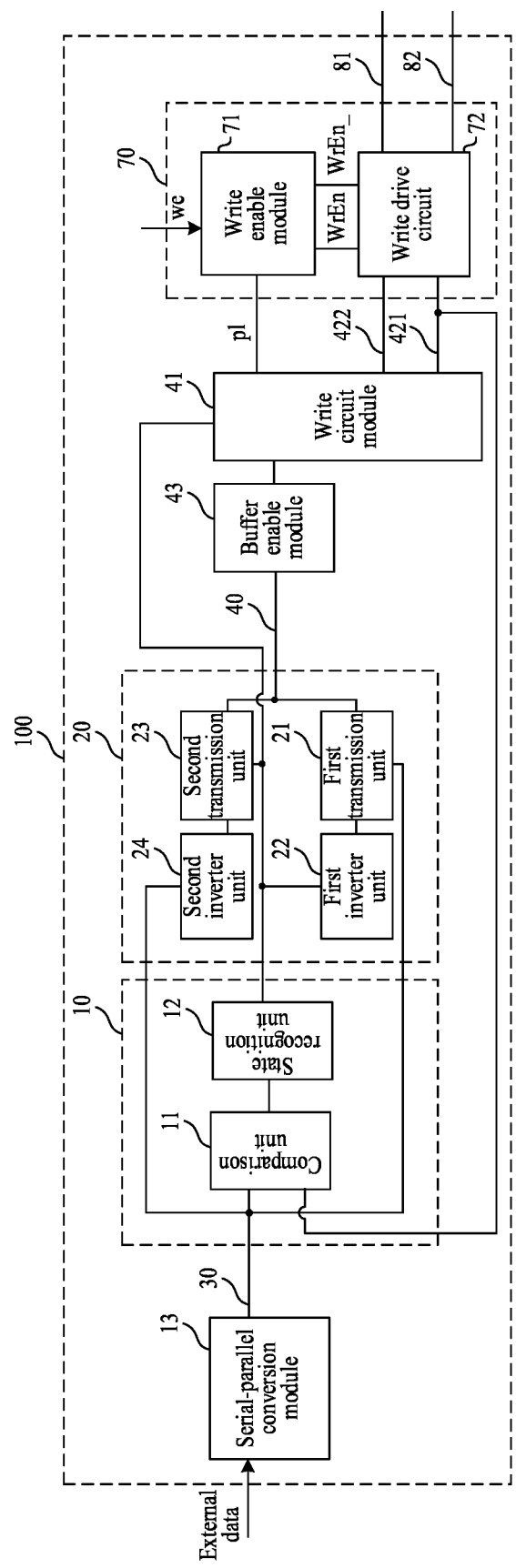
FIG. 8 is a schematic diagram of a circuitry principle of a data transmission circuit provided by an eighth embodiment of this disclosure.

Furthermore, with reference to FIG. 8, in an embodiment of this disclosure, the read-write conversion circuit 70 includes a write enable module 71 and a write drive circuit 72. The write enable module 71 generates a write enable signal WrEn and a write enable inverted signal WrEn_ according to the data polarity identification signal p1 and an initial write enable signal we. The write drive circuit 72 is configured to generate first data according to the write enable signal WrEn, the write enable inverted signal WrEn_, and the data on the global data line 421, and transmit the first data to the local data line 81 or the complementary local data line 82, to ensure the accuracy of the data transmission.

Figure 9:
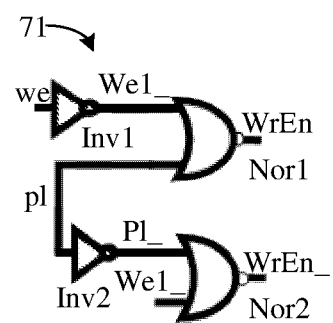
FIG. 9 is a schematic diagram of a circuit of a write enable module in a data transmission circuit provided by an embodiment of this disclosure.

As an example, with reference to FIG. 9, in an embodiment of this disclosure, the write enable module 71 includes a first inverter Inv1, a first NOR gate Nor1, a second inverter Inv2, and a second NOR gate Nor2. An input end of the first inverter Inv1 is electrically connected to the initial write enable signal we, and an output end of the first inverter Inv1 outputs a first write enable inverted signal We1_. An input end of the first NOR gate Nor1 is electrically connected to the data polarity identification signal p1 and the output end of the first inverter Inv1, and an output end of the first NOR gate Nor1 outputs the write enable signal WrEn. An input end of the second inverter Inv2 is electrically connected to a data polarity identification inverted signal p1, and an output end of the second inverter Inv2 outputs a data polarity identification inverted signal P1_. An input end of the second NOR gate Nor2 is electrically connected to the output end of the second inverter Inv2 and the output end of the first inverter Inv1, and an output end of the second NOR gate Nor2 outputs a write enable inverted signal WrEn_. Hence, the write drive circuit 72 is controlled, according to the write enable signal WrEn and the write enable inverted signal WrEn_, to generate the first data according to the data on the global data line and transmit the first data to the local data line LIO_ or the complementary local data line LIO_, so as to ensure the accuracy of the data transmission.

Figure 10:
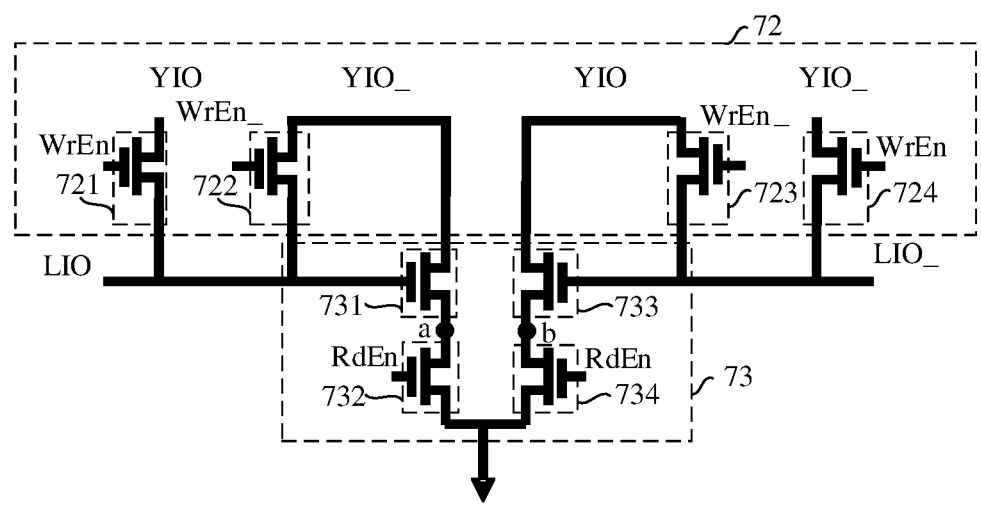
FIG. 10 is a schematic diagram of a circuit of a write drive circuit in a data transmission circuit provided by an embodiment of this disclosure.

As an example, with reference to FIG. 10, in an embodiment of this disclosure, the write drive circuit 72 includes a first switch unit 721, a second switch unit 722, a third switch unit 723, and a fourth switch unit 724. The first switch unit 721 is configured to be electrically connected to the local data line LIO and the global data line YIO according to the write enable signal WrEn. The second switch unit 722 is configured to be electrically connected to the local data line LIO and the complementary global data line YIO_ according to the write enable inverted signal WrEn_. The third switch unit 723 is configured to be electrically connected to the complementary local data line LIO_ and the global data line YIO according to the write enable inverted signal WrEn_. The fourth switch unit 724 is configured to be electrically connected to the complementary local data line LIO_ and the complementary global data line YIO_ according to the write enable signal WrEn WrEn. Hence, the recovery of transmitted data is implemented and the accuracy of data transmission is ensured.

As an example, continuously referring to FIG. 10, in an embodiment of this disclosure, the read-write conversion circuit 70 further includes a read drive circuit 73. The read drive circuit 73 includes a fifth switch unit 731, a sixth switch unit 732, a seventh switch unit 733, and an eighth switch unit 734. A control end of the fifth switch unit 731 is electrically connected to the local data line LIO, and the fifth switch unit is electrically connected to the complementary global data line 422 and a first node a according to a signal on the control end. The sixth switch unit 732 is electrically connected to the first node a and a grounding end according to a read enable signal. A control end of the seventh switch unit 733 is electrically connected to the complementary local data line LIO_, and the seventh switch unit is electrically connected to the global data line YIO and a second node b according to a signal on the control end. The eighth switch unit 734 is electrically connected to the second node b and the ground end according to the read enable signal. In this embodiment, the number of inverting the write data during the transmission is effectively reduced, to effectively reduce the power consumption during the process of writing the data into the local data line LIO or the complementary local data line LIO_ through the serial-parallel conversion module 13, the data bus Data bus, the global data line YIO, or the complementary global data line YIO_.

Figure 11A:
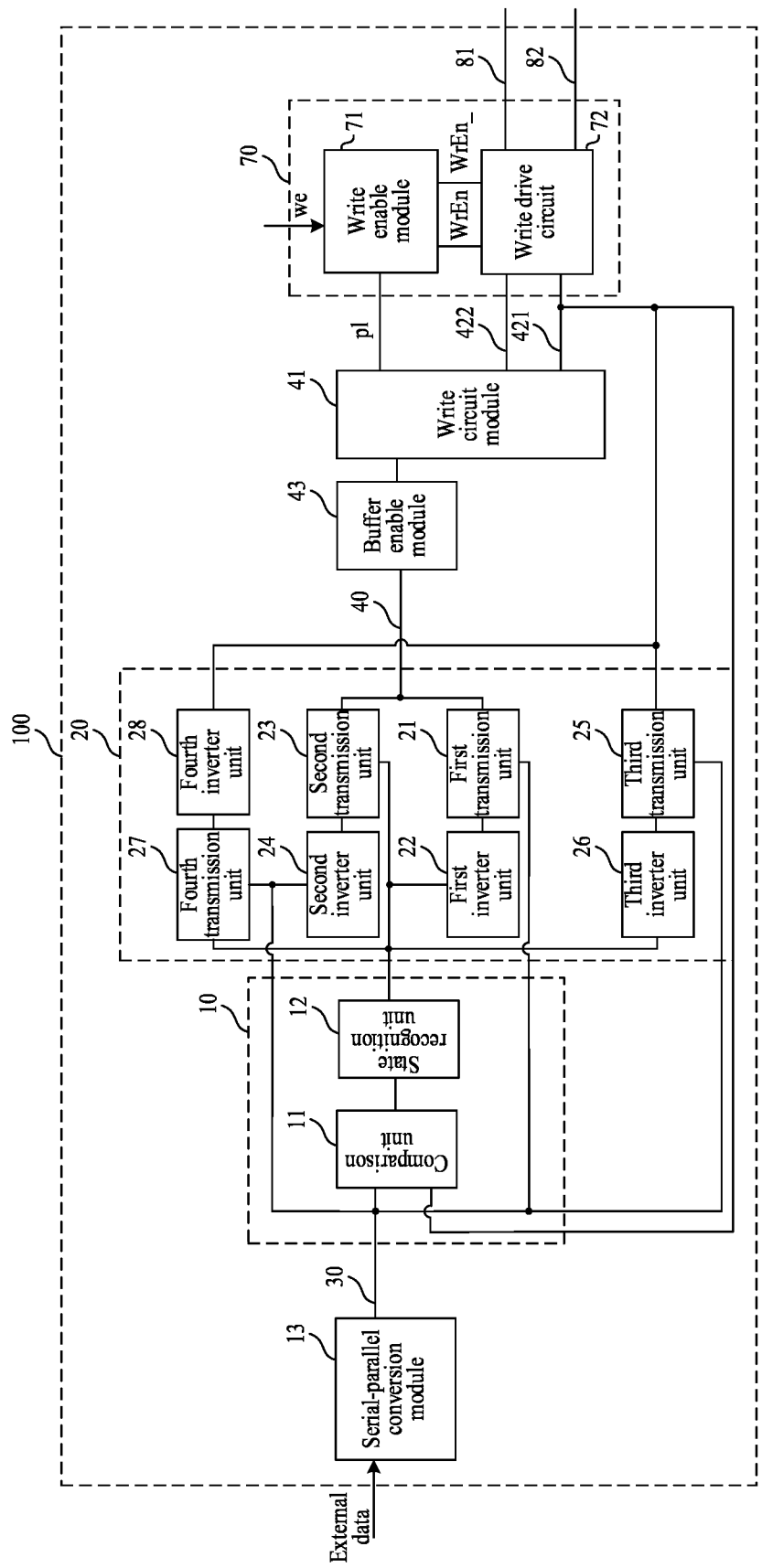
FIG. 11A is a schematic diagram of a circuitry principle of a data transmission circuit provided by a ninth embodiment of this disclosure.
Figure 11B:
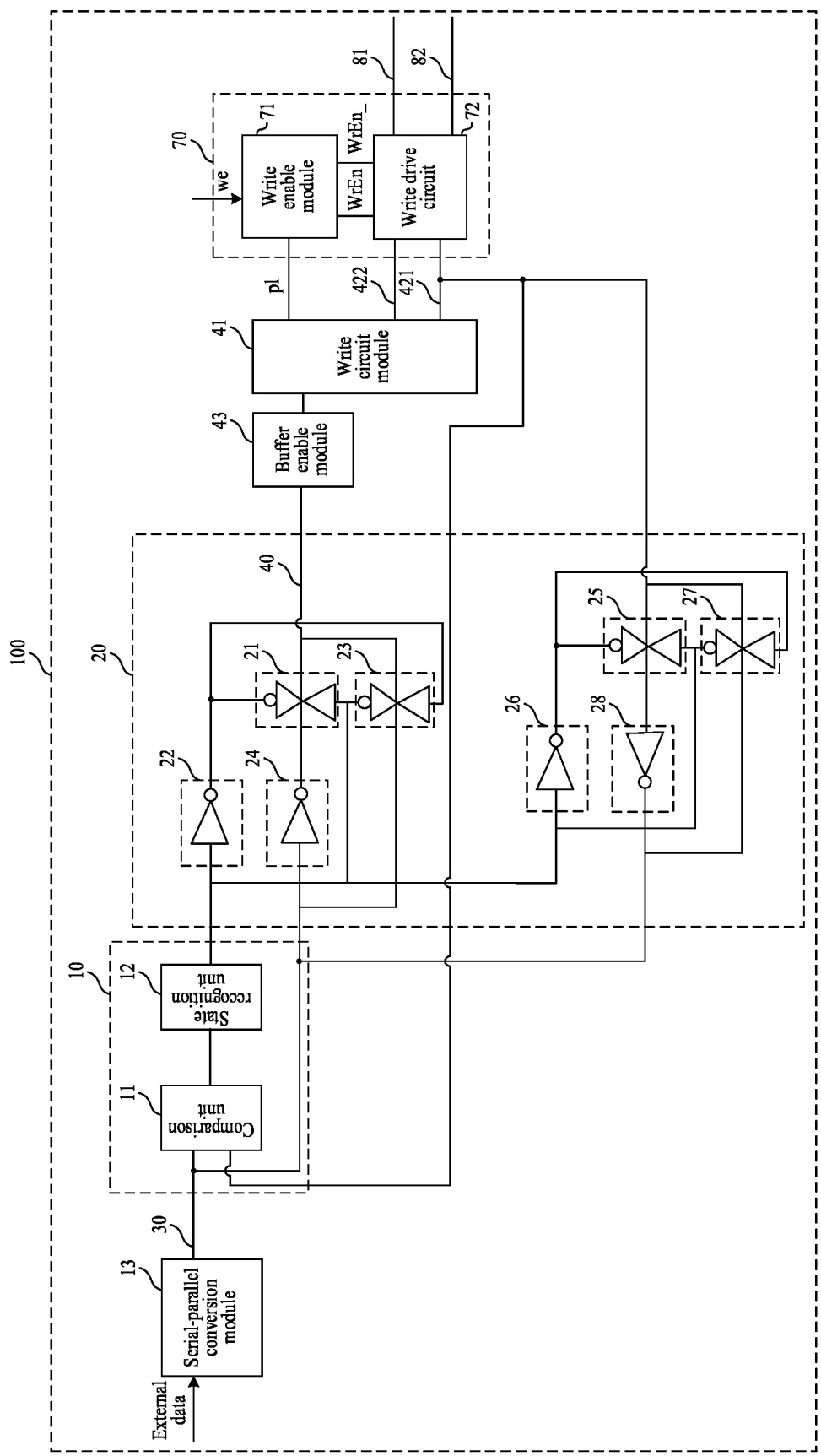
FIG. 11B is a schematic diagram of an implementation of FIG. 11A.

As an example, with reference to FIG. 11A and FIG. 11B, in an embodiment of this disclosure, the data conversion module 20 further includes a third transmission unit 25, a third inverter unit 26, a fourth transmission unit 27, and a fourth inverter unit 28. The third transmission unit is electrically connected to the serial-parallel conversion module 13 and the global data line 421, and is electrically connected to the output end of the comparison module 10 through the third inverter unit. Responsive to that the comparison result outputted by the comparison module 10 indicates that the preset threshold is not exceeded, and the data on the global data line 421 is transmitted to the serial-parallel conversion module 13. The fourth transmission unit is electrically connected to the global data line 421 and the output end of the comparison module 10, is electrically connected to the serial-parallel conversion module 13 through the fourth inverter unit, and is configured to, responsive to that the comparison result indicates that the preset threshold is exceeded, invert the data on the global data line 421 and then transmit the inverted data to the serial-parallel conversion module 13. The number of inverting the read data during the transmission between the storage array region and the data pad are reduced while ensuring the accuracy of transmitting the read data in batches, so as to effectively reduce the power consumption during the read data in the transmission path.

Figure 12:
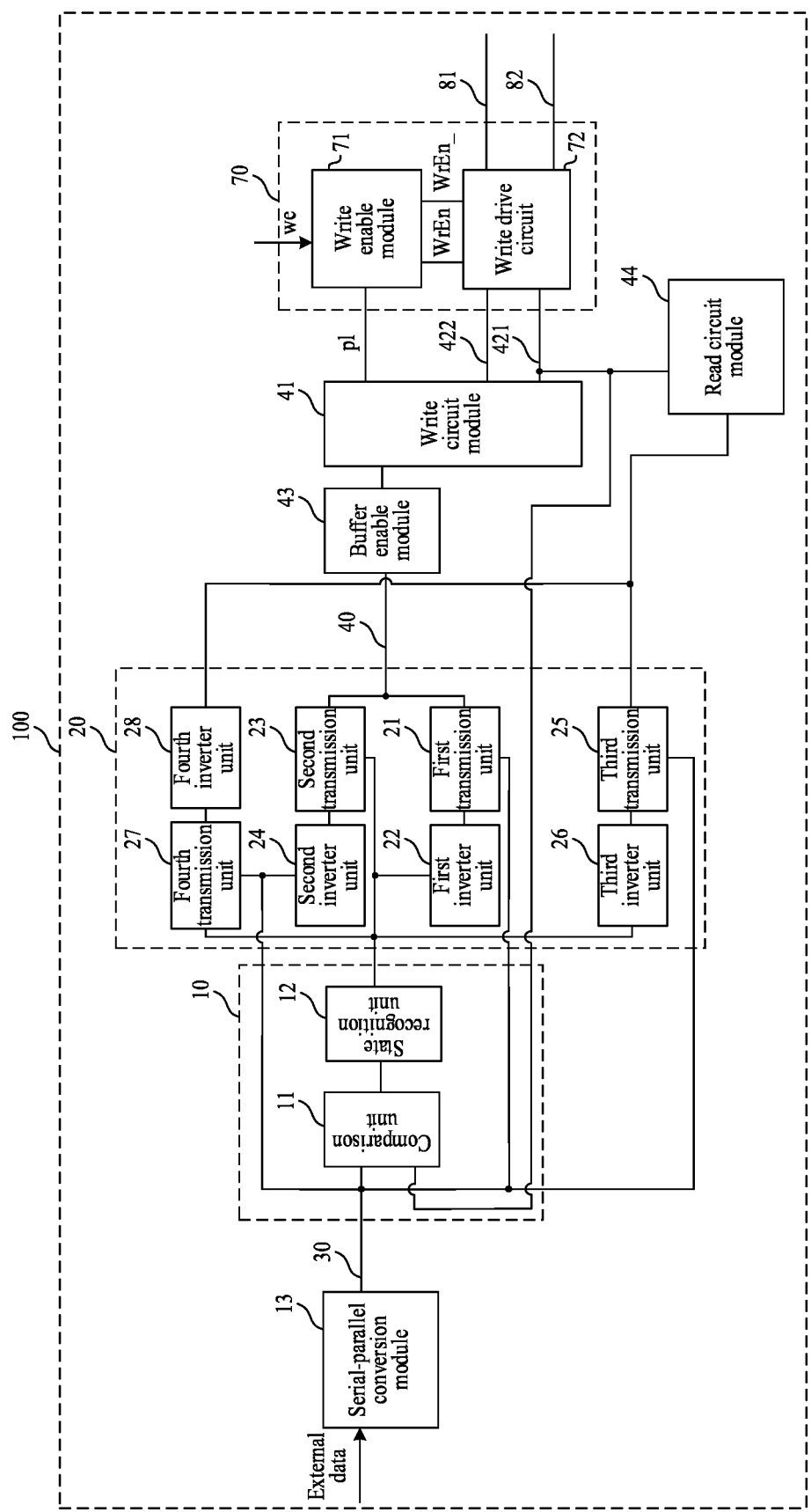
FIG. 12 is a schematic diagram of a circuitry principle of a data transmission circuit provided by a tenth embodiment of this disclosure.

Furthermore, with reference to FIG. 12, in an embodiment of this disclosure, the data transmission circuit 100 further includes a read circuit module 44. The read circuit module 44 is configured to transmit the data on the global data line 421 to the third transmission unit 25, or invert the data on the global data line 421 through the fourth inverter unit 28 and then transmit the inverted data to the fourth transmission unit 27, to accurately read data which is read in batches from the storage array region through the serial-parallel conversion module 13.

Furthermore, an embodiment of this disclosure provides a storage device, including the data transmission circuit of any one of the embodiments of this disclosure, and configured to store and transmit data of a read operation or a write operation.

Regarding the definitions of the storage device in the embodiment above, reference may be made to specific definitions for the data transmission circuit described above, and the details are not repeated herein.

Figure 13:
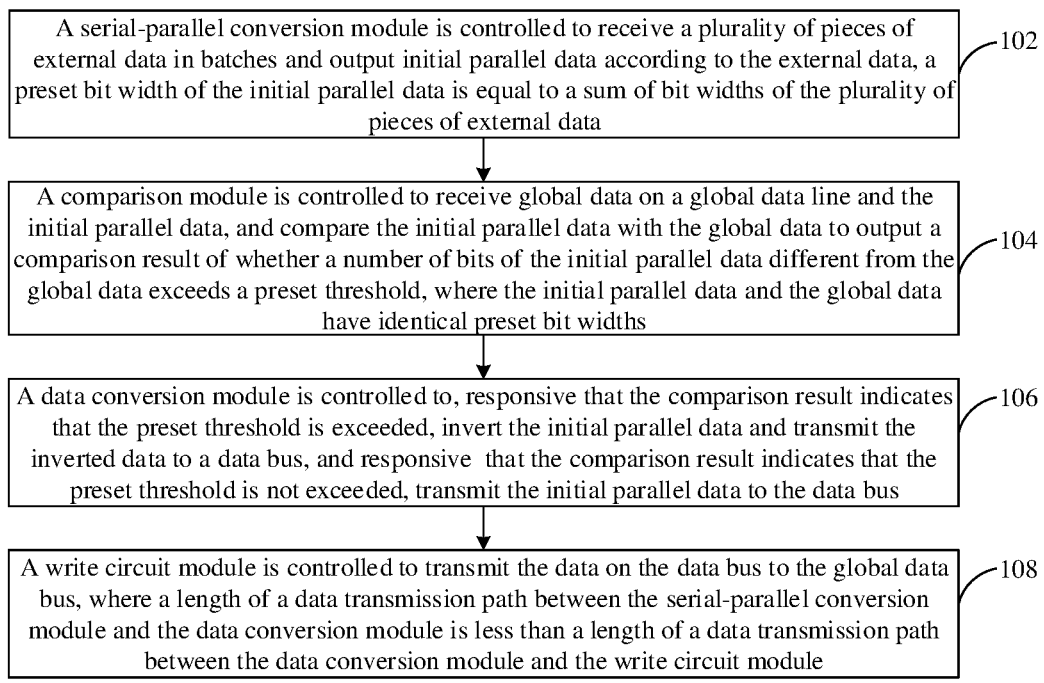
FIG. 13 is a flow chart of a data transmission method provided by an embodiment of this disclosure.

Furthermore, with reference to FIG. 13, an embodiment of this disclosure provides a data transmission method. The method includes the following operations 102 to 108.

At 102, a serial-parallel conversion module is controlled to receive a plurality of pieces of external data in batches and output initial parallel data according to the external data. A preset bit width of the initial parallel data is a sum of bit widths of the plurality of pieces of external data.

At 104, a comparison module is controlled to receive global data on a global data line and the initial parallel data, and compare the initial parallel data with the global data to output a comparison result of whether the number of bits of the initial parallel data which are different from the global data exceeds a preset threshold. The initial parallel data and the global data have identical preset bit widths.

At 106, a data conversion module is controlled to, responsive to that the comparison result indicates that the preset threshold is exceeded, invert the initial parallel data and then transmit the inverted data to the data bus, and responsive to that the comparison result indicates that the preset threshold is not exceeded, transmit the initial parallel data to the data bus.

At 108, a write circuit module is controlled to transmit the data of the data bus to the global data bus. A length of a data transmission path between the serial-parallel conversion module and the data conversion module is less than a length of a data transmission path between the data conversion module and the write circuit module.

Specifically, continuously referring to FIG. 13, the serial-parallel conversion module is controlled to receive a plurality of pieces of external data in batches and output initial parallel data according to the received external data. A preset bit width of the initial parallel data is a sum of bit widths of the plurality of pieces of external data, so as to implement data input in batches. The comparison module is controlled to compare the received initial parallel data with the global data to output a comparison result of whether the number of bits of the initial parallel data which are different from the global data exceeds a preset threshold. The initial parallel data and the global data have identical preset bit widths. The data conversion module is controlled to, responsive to that the comparison result indicates that the preset threshold is exceeded, invert the initial parallel data and then transmit the inverted data to the data bus, and responsive to that the comparison result indicates that the preset threshold is not exceeded, transmit the initial parallel data to the data bus, so that the write circuit module transmits data of the data bus to a global data bus. Since the transmitted data generally includes a data string consisting of 0 and 1, by applying a power saving algorithm in a process of transmitting the in-batch write data to the rear-stage data line through the data bus, the number of inverting data in the data bus is reduce while ensuring transmission accuracy of the data, to effectively reduce the power consumption during the data transmission on the data bus. The number of inverting the write data during the transmission between the data pad and the storage array region are reduced under the premise of ensuring the transmission accuracy of the write data in batch, so as to effectively reduce the power consumption of the data in the transmission path. A length of a data transmission path between the serial-parallel conversion module and the data conversion module is less than a length of a data transmission path between the data conversion module and the write circuit module, so as to avoid an abnormality from occurring in the write data during the transmission in the data bus, and effectively improve the accuracy of the write data during the transmission in the data bus having a long transmission path. The power consumption of the data transmission path between the data pad and the storage array region is reduced while ensuring that the density and the number of the storage units in the storage unit array do not reduce and the efficiency for reading data or writing data in batches is not lowered, thereby effectively improving the power saving performance of the semiconductor storage device.

An embodiment of this disclosure provides a computer-readable storage medium, having a computer program stored thereon. The computer program, when executed by a processor, implements the transmission method of any one of the embodiments of this disclosure.

It is to be understood that although the operations in the flowchart in FIG. 13 are shown in sequence according to arrows, the operations are not necessarily performed in the sequence indicated by the arrows. Unless otherwise explicitly specified in this disclosure, an execution order of the operations is not strictly limited, and the operations may be performed in other sequences. Moreover, at least a part of the operations in FIG. 13 may include a plurality of operations or a plurality of stages. These operations or stages are not necessarily executed at the same moment, but may be executed at different moments. The execution sequence of these operations or stages may not be necessarily performed sequentially, but may be performed in turn or alternately with other operations or at least a part of the operations or stages of other operations.

A person of ordinary skill in the art may understand that all or some of the flows of the methods of the foregoing embodiments may be implemented by instructing relevant hardware through computer programs. The computer programs may be stored in a non-volatile computer-readable storage medium. When the computer programs are executed, the flows of the embodiments of the foregoing methods may be included. References to the memory, the storage, the database, or other media used in the embodiments provided in this disclosure may all include a non-volatile or a volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache. By way of description rather than limitation, the RAM may be obtained in a plurality of forms, such as a static RAM (SRAM), a dynamic RAM (DRAM), a synchronous DRAM (SDRAM), a double data rate SDRAM (DDRSDRAM), an enhanced SDRAM (ESDRAM), a Synchlink DRAM (SLDRAM), a direct Rambus dynamic RAM (DRDRAM), and a Rambus dynamic RAM (RDRAM).

It is noted that the embodiments above are merely used for the purpose of explanations without the meaning of limiting the disclosure.

Further, it should be noted that the modules or units for executing operations of the data transmission circuit according to the embodiment of the present disclosure, for example, the serial-parallel conversion module, the comparison module and the comparison unit can be implemented by hardware such as circuits and processors.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope described in this description.

The foregoing embodiments show only several implementations of this disclosure and are described in detail, which, however, are not understood as a limitation to the patent scope of this disclosure. For a person of ordinary skill in the art, several modifications and improvements can be made without departing from the idea of this disclosure. These modifications and improvements fall within the protection scope of this disclosure. Therefore, the protection scope of the patent of this disclosure shall be subject to the appended claims.

The invention claimed is:

1. A data transmission circuit, comprising:
    a serial-parallel conversion module configured to receive a plurality of pieces of external data in batches and output initial parallel data according to the external data, wherein a preset bit width of the initial parallel data is equal to a sum of bit widths of the plurality of pieces of external data;
    a comparison module configured to receive global data on a global data line and the initial parallel data, and compare the initial parallel data with the global data to output a comparison result of whether a number of bits of the initial parallel data which are different from the global data exceeds a preset threshold, wherein the initial parallel data and the global data have identical preset bit widths;
a data conversion module electrically connected to the serial-parallel conversion module, the comparison module and a data bus, and configured to, responsive to that the comparison result indicates that the preset threshold is exceeded, invert the initial parallel data and transmit the inverted data to the data bus, and responsive to that the comparison result indicates that the preset threshold is not exceeded, transmit the initial parallel data to the data bus; and
a write circuit module configured to transmit data on the data bus to a global data bus;
wherein a length of a data transmission path between the serial-parallel conversion module and the data conversion module is less than a length of a data transmission path between the data conversion module and the write circuit module.

2. The data transmission circuit of claim 1, further comprising a buffer enable module, wherein
the data conversion module is connected to the write circuit module through at least one the buffer enable module in sequence and is configured to buffer data transmitted by the data bus.

3. The data transmission circuit of claim 2, wherein the global data bus comprises a global data line and a complementary global data line, and the global data line and the complementary global data line transmit signals which are inverted to each other;
the transmitting data on the data bus to the global data bus comprises:
transmitting the data on the data bus to the global data line; and
inverting the data on the data bus and transmitting the inverted data to the complementary global data line.

4. The data transmission circuit of claim 1, wherein the comparison module comprises:
a comparison unit configured to compare the initial parallel data with the global data bit by bit and output comparison state data of each bit; and
a state recognition unit electrically connected to the comparison unit, and configured to perform statistics on the comparison state data of all of the bits and output a comparison result according to a statistic result.

5. The data transmission circuit of claim 4, wherein the data conversion module comprises:
a first transmission unit which is electrically connected to the serial-parallel conversion module and the data bus, electrically connected to an output end of the state recognition unit through a first inverter unit, and configured to, responsive to that the comparison result indicates that the preset threshold is not exceeded, transmit the initial parallel data to the data bus, wherein the preset threshold is a half of the preset bit width; and
a second transmission unit, which is electrically connected to the data bus and the output end of the state recognition unit, electrically connected to the serial-parallel conversion module through a second inverter unit, and configured to, responsive to that the comparison result indicates that the preset threshold is exceeded, invert the initial parallel data and transmit the inverted data to the data bus.

6. The data transmission circuit of claim 5, wherein the write circuit module is configured to:
receive the comparison result outputted by the state recognition unit and generate a data polarity identification signal according to the comparison result.

7. The data transmission circuit of claim 6, further comprising a read-write conversion circuit configured to generate first data according to the data polarity identification signal and data on the global data bus, and transmit the first data to a local data line or a complementary local data line, wherein the local data line and the complementary local data line transmit signals inverted to each other.

8. The data transmission circuit of claim 7, wherein the read-write conversion circuit comprises:
a write enable module configured to generate a write enable signal and a write enable inverted signal according to the data polarity identification signal and an initial write enable signal; and
a write drive circuit configured to generate the first data according to the write enable signal, the write enable inverted signal, and the data on the global data bus.

9. The data transmission circuit of claim 8, wherein the write enable module comprises:
a first inverter having an input end electrically connected to the initial write enable signal, and an output end for outputting a first write enable inverted signal;
a first NOR gate having an input end electrically connected to the data polarity identification signal and the output end of the first inverter, and an output end for outputting the write enable signal;
a second inverter having an input end electrically connected to the data polarity identification signal, and an output end for outputting a data polarity identification inverted signal; and
a second NOR gate having an input end electrically connected to the output end of the second inverter and the output end of the first inverter, and an output end for outputting a write enable inverted signal.

10. The data transmission circuit of claim 9, wherein the write drive circuit comprises:
a first switch unit electrically connected to the local data line and the global data line according to the write enable signal;
a second switch unit electrically connected to the local data line and the complementary global data line according to the write enable inverted signal;
a third switch unit electrically connected to the complementary local data line and the global data line according to the write enable inverted signal; and
a fourth switch unit electrically connected to the complementary local data line and the complementary global data line according to the write enable signal.

11. The data transmission circuit of claim 10, wherein the read-write conversion circuit further comprises a read drive circuit which comprises:
a fifth switch unit which has a control end electrically connected to the local data line, and is electrically connected to the complementary global data line and a first node according to a signal on the control end;
a sixth switch unit electrically connected to the first node and a ground end according to a read enable signal;
a seventh switch unit which has a control end electrically connected to the complementary local data line, and is electrically connected to the global data line and a second node according to a signal on the control end; and
an eighth switch unit electrically connected to the second node and the ground end according to the read enable signal.

12. The data transmission circuit of claim 1, wherein the data conversion module further comprises:
- a third transmission unit which is electrically connected to the serial-parallel conversion module and the global data line, is electrically connected to an output end of the comparison module through a third inverter unit, and is configured to, responsive to that the comparison result indicates the preset threshold is not exceeded, transmit the data on the global data line to the serial-parallel conversion module; and
- a fourth transmission unit which is electrically connected to the global data line and the output end of the comparison module, is electrically connected to the serial-parallel conversion module through a fourth inverter unit, and configured to, responsive to that the comparison result indicates that the preset threshold is exceeded, invert the data on the global data line and transmit the inverted data to the serial-parallel conversion module.

13. The data transmission circuit of claim 12, further comprising:
- a read circuit module configured to transmit the data on the global data line to the third transmission unit, or invert the data on the global data line through the fourth inverter unit and transmit the inverted data to the fourth transmission unit.

14. A storage device, comprising the data transmission circuit of claim 1, and configured to store and transmit data of a read operation or a write operation.

15. The storage device of claim 14, wherein the data transmission circuit further comprises a buffer enable module, wherein
the data conversion module is connected to the write circuit module through at least one the buffer enable module in sequence and is configured to buffer data transmitted by the data bus.

16. The storage device of claim 15, wherein the global data bus comprises a global data line and a complementary global data line, and the global data line and the complementary global data line transmit signals which are inverted to each other;
the transmitting data on the data bus to the global data bus comprises:
transmitting the data on the data bus to the global data line; and
inverting the data on the data bus and transmitting the inverted data to the complementary global data line.

17. The storage device of claim 14, wherein the comparison module comprises:
- a comparison unit configured to compare the initial parallel data with the global data bit by bit and output comparison state data of each bit; and
- a state recognition unit electrically connected to the comparison unit, and configured to perform statistics on the comparison state data of all of the bits and output a comparison result according to a statistic result.

18. The storage device of claim 17, wherein the data conversion module comprises:
- a first transmission unit which is electrically connected to the serial-parallel conversion module and the data bus, electrically connected to an output end of the state recognition unit through a first inverter unit, and configured to, responsive to that the comparison result indicates that the preset threshold is not exceeded, transmit the initial parallel data to the data bus, wherein the preset threshold is a half of the preset bit width; and
- a second transmission unit, which is electrically connected to the data bus and the output end of the state recognition unit, electrically connected to the serial-parallel conversion module through a second inverter unit, and configured to, responsive to that the comparison result indicates that the preset threshold is exceeded, invert the initial parallel data and transmit the inverted data to the data bus.

19. The storage device of claim 18, wherein the write circuit module is configured to:
receive the comparison result outputted by the state recognition unit and generate a data polarity identification signal according to the comparison result.

20. A data transmission method, comprising:
controlling a serial-parallel conversion module to receive a plurality of pieces of external data in batches and output initial parallel data according to the external data, wherein a preset bit width of the initial parallel data is equal to a sum of bit widths of the plurality of pieces of external data;
controlling a comparison module to receive global data on a global data line and the initial parallel data, and compare the initial parallel data with the global data to output a comparison result of whether a number of bits of the initial parallel data which are different from the global data exceeds a preset threshold, wherein the initial parallel data and the global data have identical preset bit widths;
controlling a data conversion module to, responsive to that the comparison result indicates that the preset threshold is exceeded, invert the initial parallel data and transmit the inverted data to a data bus, and to, responsive to the comparison result indicates that the preset threshold is not exceeded, transmit the initial parallel data to the data bus; and
controlling a write circuit module to transmit data on the data bus to a global data bus, wherein a length of a data transmission path between the serial-parallel conversion module and the data conversion module is less than a length of a data transmission path between the data conversion module and the write circuit module.

* * * * *